United States Patent [19]

Lin

[11] Patent Number: 6,117,599
[45] Date of Patent: Sep. 12, 2000

[54] ALIGNMENT AND EXPOSURE PROCESS UTILIZING SPLIT BEAM FOR EXPOSURE AND ALIGNMENT

[75] Inventor: Benjamin Szu-Min Lin, Chiayi, Taiwan

[73] Assignee: United Microelectronics Corp., Hsinchu, Taiwan

[21] Appl. No.: 09/307,045

[22] Filed: May 7, 1999

[51] Int. Cl.⁷ .................................................. G03F 9/00
[52] U.S. Cl. ............................................................ 430/22
[58] Field of Search ................................................. 430/22

[56] References Cited

U.S. PATENT DOCUMENTS 5,874,190   2/1999   Tanaka ........................................ 430/22

*Primary Examiner*—Christopher G. Young
*Attorney, Agent, or Firm*—Hickman Coleman & Hughes, LLP

[57] ABSTRACT

An alignment and exposure process that use the same incident beam. A substrate having a photoresist formed on an upper surface of the substrate is provided. At least one alignment mark is located on a bottom surface of the substrate. A mask is located over the photoresist. An incident beam is projected onto a light splitter over the mask, wherein the incident beam is reflected onto the alignment mark to align the mask with the substrate. The first light is split into a transmission light and a reflection light. The transmission light passes through the light splitter and the mask to expose the photoresist and the reflection light is projected onto the alignment mark to dynamically align the mask with the substrate.

6 Claims, 1 Drawing Sheet

ALIGNMENT AND EXPOSURE PROCESS UTILIZING SPLIT BEAM FOR EXPOSURE AND ALIGNMENT

BACKGROUND OF THE INVENTION

1. Field of the Invention

The present invention relates to an alignment and exposure process. More particularly, the present invention relates to an alignment and exposure process that use the same light source.

2. Description of the Related Art

Typically, the photolithography process is an important part of the semiconductor process. The photolithography process comprises the steps of forming a photoresist over a substrate. A light from a light source is projected onto the photoresist through a mask to replicate a pattern on a mask in the photoresist. After the developer process and the etching process are performed, the photoresist is removed. Therefore, the pattern on the mask is completely replicated in the target dielectric layer on the substrate.

In the photolithography process, before the pattern is formed in the target dielectric layer, it is important to align the mask with the wafer. Every pattern alignment process is an accurate alignment process. In order to accurately align the mask with the wafer, there are some marks, which are alignment marks, on the predetermined location. These marks are used as alignment standards during the alignment process.

Since the accuracy of the semiconductor process is increasingly critical as the integration of the integrated circuit rises, even a tiny error occurring in the process may lead to the failure of the process. Hence, wafer consumption and the cost are increased.

Currently, the light sources used in the alignment process and the exposure process are different. A red-light source is used to perform the alignment process. A blue-light source such as ultraviolet rays or deep ultraviolet rays is used to perform the exposure process. However, after the red-light alignment process and the blue-light exposure process, what is known as a red-blue shift occurs due to the wavelength difference. In order to decrease the misalignment probability, it is necessary to compensate for the red-blue shift by extra equipment calibration.

SUMMARY OF THE INVENTION

The invention provides an alignment and exposure process that use the same light source. By using the invention, the red-blue shift can be avoided. Moreover, wafer consumption and the cost can be decreased. Furthermore, the mask can be dynamically aligned with the wafer in the exposure process.

To achieve these and other advantages and in accordance with the purpose of the invention, as embodied and broadly described herein, the invention provides an alignment and exposure process that use the same light source. A substrate having a photoresist formed on a top surface of the substrate is provided. At least one alignment mark is located on a bottom surface of the substrate. A mask is located over the photoresist. An incident beam is projected onto a light splitter over the mask, wherein the light is reflected onto the alignment mark to align the mask with the substrate. The incident beam light is split into a transmission light and a reflection light. The transmission light passes through the light splitter onto the mask to expose the photoresist, while the reflection light is directed to project onto the alignment mark to dynamically align the mask with the substrate.

The invention provides an alignment and exposure process that use a single light source. A substrate having a photoresist formed on a top surface of the substrate is provided. At least one alignment mark is located on a bottom surface of the substrate. A mask is located over the photoresist. A pre-alignment process is performed by projecting an incident beam onto the alignment mark to align the mask with the substrate. An exposure process is performed by splitting the incident beam into a transmission light and a reflection light. The transmission light exposes the photoresist and the reflection light is projected onto the alignment mark to dynamically align the mask with the substrate. Since the wavelength of the incident beam in the pre-alignment process and in the exposure process are the same, the red-blue shift can be avoided. It is unnecessary to compensate for the red-blue shift by extra equipment calibration. Moreover, the mask can be relatively accurately aligned with the wafer, so that the wafer consumption and the cost can be decreased. Furthermore, the mask can be dynamically aligned with the wafer in the exposure process.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

Figure 1A:
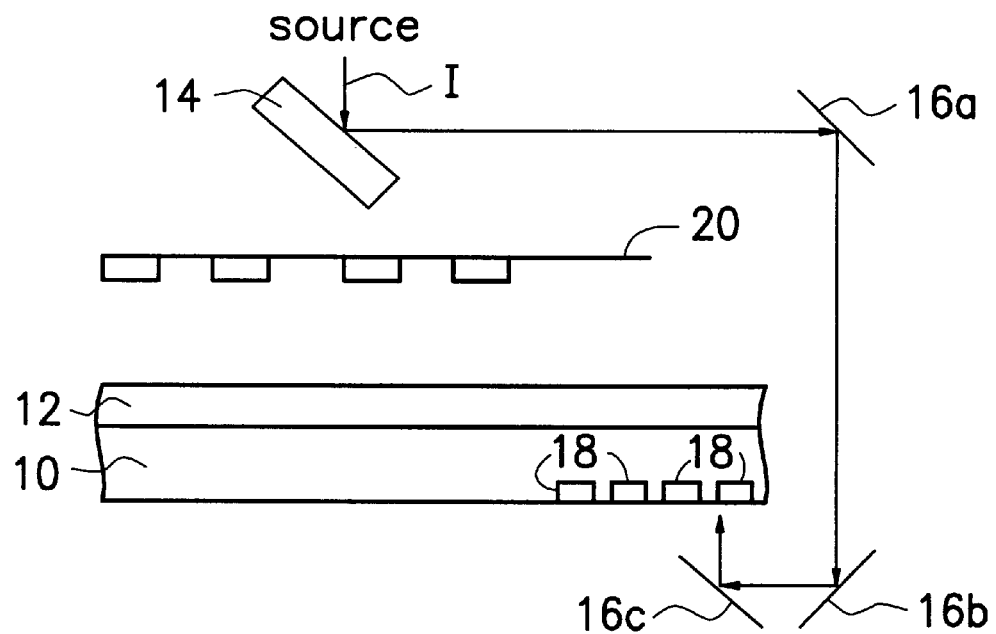
FIGS. 1A through 1B are schematic, cross-sectional views of an alignment and exposure process that use a single incident beam in a preferred embodiment according to the invention.

Reference will now be made in detail to the present preferred embodiments of the invention, examples of which are illustrated in the accompanying drawings. Wherever possible, the same reference numbers are used in the drawings and the description to refer to the same or like parts.

Figure 1B:
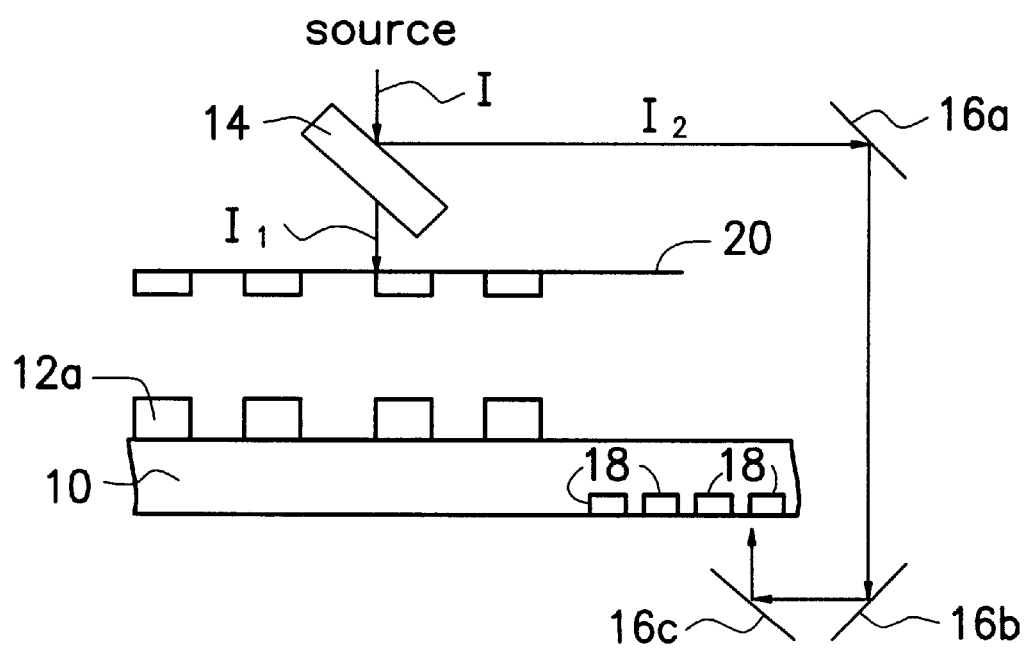

FIGS. 1A through 1B are schematic, cross-sectional views of an alignment and exposure process that use a single incident beam in a preferred embodiment according to the invention.

As shown in FIG. 1A, a substrate 10 having a photoresist 12 formed on a top surface thereof is provided. Several alignment marks 18 are located on a bottom surface of the substrate 10. Integrated circuits (not shown) have been previously formed in or on the substrate 10. A pre-alignment process is performed with a mask 20 over the photoresist 12 to align the mask 20 with the substrate 10. In the pre-alignment process, an incident beam I is projected onto a light splitter 14 over the mask 20 from a light source. The incident beam I reflected by the light splitter is projected onto mirrors 16a, 16b and 16c in sequence. The reflected incident beam $I_2$ is projected onto one of the bottom alignment marks 18 to align the mask 20 with the substrate 10.

As shown in FIG. 1B, after the pre-alignment process, the light splitter 14 is turned to a specific angle, so that the incident beam I is split into two lights, which are a transmission light $I_1$ and the reflection light $I_2$. The transmission light $I_1$ passes through the light splitter 14 onto the mask 20 to expose the photoresist 12 (as shown in FIG. 1A). The mask pattern 20 is replicated in the photoresist 12. Meanwhile, the reflection light $I_2$ is reflected by the light splitter 14 and the mirrors 16a, 16b and 16c. The reflection light $I_2$ is projected onto one of the bottom alignment marks 18 to align the mask 20 with the substrate 10. Therefore, the mask 20 can dynamically align with the substrate 10 while the exposure process is performed. A developer process is performed to transform the photoresist 12 (as shown in FIG. 1A) into a patterned photoresist 12a (as shown in FIG. 1B). In this example, the photoresist is denoted as a positive photoresist. In application, the photoresist can be a positive photoresist or a negative photoresist.

In the invention, the alignment marks are located at the bottom of a wafer, and a single incident beam is used in the pre-alignment process and in the exposure process. Since the wavelength of the light source in the pre-alignment process and in the exposure process are the same, the red-blue shift can be avoided. Hence, it is unnecessary to compensate for the red-blue shift by extra equipment calibration. Moreover, the mask can be relatively accurately aligned with the wafer. Therefore, the wafer consumption and the cost can be decreased. Furthermore, the partial light is projected onto the bottom alignment marks while the exposure process is performed, so that the mask can be dynamically aligned with the wafer in the exposure process.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. An alignment and exposure process using a single incident beam, performed on a substrate having a photoresist formed on a top surface thereof, wherein at least an alignment mark is located on a bottom surface of the substrate, the process comprising the steps of:

locating a mask over the photoresist; and projecting an incident beam onto a light splitter over the mask, so that the incident light is split into a transmission light and a reflection light, the transmission light passing through the light splitter to shine onto the mask to expose the photoresist and the reflection light being directed to project onto the alignment mark to dynamically align the mask with the substrate.

2. The process of claim 1, wherein before the step of splitting the incident beam, further comprises turning the light splitter to a specific angle.

3. The process of claim 1, wherein the incident beam and the reflection light are projected onto the alignment mark by a plurality of mirrors.

4. An alignment and exposure process that use a single incident beam, performed on a substrate having a photoresist formed on a top surface of the substrate, wherein at least an alignment mark is located on a bottom surface of the substrate, comprising, the steps of:

locating a mask over the photoresist;

performing a pre-alignment process by projecting an incident beam onto the alignment mark to align the mask with the substrate; and performing an exposure process by splitting the incident beam into a transmission light and a reflection light, wherein the transmission light exposes the photoresist and the reflection light is projected onto the alignment mark to dynamically align the mask with the substrate.

5. The process of claim 4, wherein before the step of performing the exposure process, further comprises a light splitter with a specific angle used to split the incident beam.

6. The process of claim 4, wherein the incident beam and the reflection light are projected onto the alignment mark by a plurality of mirrors.

* * * * *